US006512989B1

(12) United States Patent
Deome et al.

(10) Patent No.: US 6,512,989 B1
(45) Date of Patent: *Jan. 28, 2003

(54) GENERATING AND CONTROLLING ANALOG AND DIGITAL SIGNALS ON A MIXED SIGNAL TEST SYSTEM

(75) Inventors: Mark Deome, San Jose; Donald V. Organ, Saratoga, both of CA (US)

(73) Assignee: LTX Corporation, Westwood, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/276,849

(22) Filed: Mar. 26, 1999

(51) Int. Cl.⁷ .............................................. G06F 19/00
(52) U.S. Cl. ...................... 702/124; 702/122; 702/123
(58) Field of Search ................................. 702/108, 119, 702/123, 124, 112, 118, 122; 714/724, 731, 744; 341/120, 152; 345/969, 970

(56) References Cited

U.S. PATENT DOCUMENTS

| 5,226,118 | A | * | 7/1993 | Baker et al. ................. 345/833 |
| 5,235,549 | A | | 8/1993 | Young et al. ................. 365/201 |
| 5,589,763 | A | * | 12/1996 | Burns |
| 5,646,521 | A | * | 7/1997 | Rosental et al. ............. 714/724 |
| 5,748,124 | A | * | 5/1998 | Rosenthal et al. ........... 341/120 |
| 5,781,557 | A | | 7/1998 | Greason et al. ............. 371/21.1 |
| 5,918,198 | A | * | 6/1999 | Ricca et al. ................. 702/110 |
| 5,938,780 | A | * | 8/1999 | Panis .......................... 714/724 |
| 6,085,341 | A | | 7/2000 | Greason et al. ............. 714/718 |

OTHER PUBLICATIONS

LTX Corporation, Delta/STE Test System Product Description, Sections 1 to 10–30, Mar. 1998.*
Norton, Eric B. *New Approaches to DSP Software Reduce Test–Program Development*. EE–Evaluation Engineering. 1995. pp. 37–39.
Organ, Don. *enVision™:the inside story*. 1990 IEEE. 1990 International Test Conference Paper 25.3. 1990. pp. 530–536.
*Deltamaster*. Deltamaster Test System. LTX information sheet. pp. 1–3, (no date).
*LTX Sales Brochure for Trillium Test Systems*. LTX Sales Brochure. pp. 1–24, (no date).
*LTX enVision*. LTX Sales Brochure. pp. 1–3, (no date).
*LTX Annual Report 1994*. LTX Corporation. 1994. 5 pages.
*The Delta 100, A breakthrough ATE architecture for the next generation of VLSI*. LTX Corporation. 17 pages, (no date).
*LTX Delta/STE Test Systems Product Description*. LTX Corporation. Mar. 1998. Cover sheet w/pp. i through 10–30.
The Synchro Test System, "LTX Synchro Technical Manual: Linear Subsystem Programming", Chapters 1–2 and 4–6, Operating System SR5.50 (1997).

(List continued on next page.)

Primary Examiner—John S. Hilten
Assistant Examiner—Bryan Bui
(74) Attorney, Agent, or Firm—Blakely, Sokoloff, Taylor & Zafman LLP

(57) ABSTRACT

An automated test system that has analog and digital resources for testing mixed signal ICs. A control pattern is provided that is used by the automated test system to simultaneously control both the digital resources and the analog resources. The control pattern is comprised of a sequentially executed two-dimensional array with columns corresponding to analog and digital resources. The automated test system uses the control pattern to control both the analog and digital resources.

37 Claims, 10 Drawing Sheets

OTHER PUBLICATIONS

The Synchro Test System, "LTX Synchro Technical Manual: Digital Subsystem Programming", Chapters 1–5 14, 22, and 24, Operating System SR5.5.0 (1997).

The Synchro Test System, "LTX Synchro Technical Manual: VMS08", Chapters 2–4, Operating System SR5.5.0 (1997).

The Synchro Test System, "LTX Synchro Technical Manual: VMS20", Chapters 2–4, Operating System SR5.5.0 (1997).

The Synchro Test System, "LTX Synchro Technical Manual: Tester Control", Chapter 1, Operating System SR5.5.0 (1997).

The Synchro Test System, "LTX Synchro Technical Manual: PVI", Chapter 2, Operating System SR5.5.0 (1997).

The Synchro Test System, "LTX Synchro Technical Manual: RF01", Chapter 3, Operating System SR5.5.0 (1997).

The Synchro Test System, "LTX Synchro Technical Manual: WBS", Chapters 2–4, Operating System SR5.5.0 (1997).

The Synchro Series: High Performance Mixed Signal ATE, LTX Corporation (1996).

Norton, Eric B. *New Approaches to DSP Software Reduce Test–Program Development*. EE–Evaluation Engineering. 1995. pp. 37–39.*

Organ, Don. *enVision™: the inside story*. 1990 IEEE. 1990 International Test Conference Paper Mar. 25, 1990. pp. 530–536.*

*Deltamaster*. Deltamaster Test System. LTX information sheet. pp. 1–3. (No date).*

*LTX Sales Brochure for Trillium Test Systems*. LTX Sales Brochure. pp. 1–24 (No date).*

*LTX enVision*. LTX Sales Brochure. pp. 1–3. (No date).*

*LTX Annual Report 1994*. LTX Corporation. 1994, 5 pages.*

*The Delta 100, A breakthrough ATE architecture for the next generation of VLSI*. LTX Corporation. 17 pages. (No date).*

*LTX Delta/STE Test Systems Product Description*. LTX Corporation. Mar. 1998. Cover sheet w/pp. i through 10–30.*

* cited by examiner

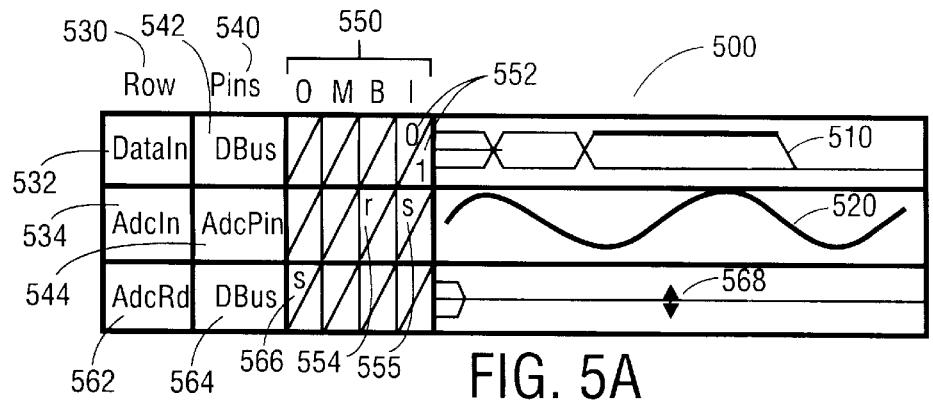
FIG. 5A
FIG. 5B
FIG. 6

GENERATING AND CONTROLLING ANALOG AND DIGITAL SIGNALS ON A MIXED SIGNAL TEST SYSTEM

FIELD OF THE INVENTION

The present invention pertains to the field of automated electronic test systems for testing integrated circuits. More particularly, the present invention relates to generating and controlling analog and digital signals on an electronic tester platform that includes analog and digital resources.

BACKGROUND

Automated test systems, also known as automatic test equipment ("ATE") or "testers," have been widely used in semiconductor and electronics manufacturing processes. Semiconductor integrated circuits are generally tested at least once during manufacturing processes. In most instances, a semiconductor is fabricated on a silicon substrate and tested at the wafer level. The semiconductor is then packaged and a final test is conducted prior to delivery to the customer, for example.

The various kinds of semiconductor integrated circuits ("ICs") requiring such testing include analog ICs, digital ICs, and mixed signal ICs. Examples of analog ICs include amplifiers, voltage regulators, clock circuits, and phase lock loops. Digital ICs include high-speed very large scale integrated ("VLSI") circuits such as microprocessors, microcontrollers, and digital signal processors, for example. Mixed signal ICs combine analog and digital functionality on a single semiconductor substrate or "chip." Examples of mixed signal ICs include digital-to-analog converters ("DACs"), analog-to-digital converters ("A/D converters"), and coder-decoders ("CODECs"), for example.

Testing mixed signal ICs on ATEs presents many unique challenges that are not present when testing either analog or digital ICs alone. For example, when testing a DAC it is necessary to apply a digital representation of an analog waveform at the digital inputs of the device under test ("DUT"), and then measure and perform calculations on the analog output. Conversely, when testing A/D converters it is necessary to transmit an analog signal to the analog inputs of the DUT and measure a digital representation of the analog signal appearing at the outputs. In order to obtain proper test results, there must be a high degree of synchronization between the digital and analog resources of the ATE.

FIG. 1 shows one example of an ATE architecture. The ATE includes a network interface computer ("NIC") 101 to oversee the various tester resources. An enVision++ executive system 103 is the operating environment for the ATE. Cadence™ 105 is the executive system for tester controller 111. Cadence is also the name for the computer language for writing analog test programs. Therefore, enVision++ and the Cadence subsystem comprise the ATE system control software. NIC 101 is connected to tester controller 111 and test process accelerator 113 via bus adapter 121 and bus 109. Test process accelerator is connected to digital resources 171, 173, and 175 through bus adapters 123 and 125. Tester controller 111 is connected to analog resources 181, 183, and 185 through bus adapter 127. Action packet 130 is sent from test controller 111 to the analog resources 181, 183, and 185 to perform analog testing. Similarly, test process accelerator sends a signal over bus adapters 123 and 125 to perform digital testing. Both the digital and the analog resources are connected to test head 150. Mixed signal testing is implemented by providing the analog and digital resources with the necessary control information so that the resources can transmit and receive the digital and analog signals required by the DUT 151 with the proper degree of synchronization.

To perform mixed signal IC testing, a programmer is required to specify analog and digital test waveforms using the ATE system control software. Analog tests require the programmer to specify various settings on the analog instruments using an ASCII based programming language such as Cadence™. Digital testing, on the other hand, requires the utilization of long sequentially executed streams of digital data known as "test vectors" or "patterns." For mixed signal testing, patterns are typically created by a programmer via graphical interaction with the system development tools provided, such as enVision++. Difficulty arises because the analog and digital waveforms are generated by different subsections of the ATE. Additionally, analog signal generation and digital signal generation has also traditionally been conceptualized in different terms. Therefore, in order to develop a mixed signal test program, programmers are required to understand the complex interaction between the digital and analog resources as the test program is executing a mixed signal test. This results in an increase in the development cycle time for a given test program. Simplification of the relationship between the analog and digital waveforms would result in reducing the amount of time required for a programmer to develop a test program. This is desirable because it would decrease development cycles and allow semiconductor manufacturers to release products to market in a shorter period of time.

One example of a prior art approach to mixed signal IC testing was to specify analog and digital test waveforms independently. For example, the main test program is defined using the enVision++ executive system. The main program is comprised of a sequence of digital test routines, referred to as digital test methods, and analog test routines (Cadence procedures). FIG. 2 shows how digital waveforms are defined using the Waveform Tool 200. Digital waveforms for each pin or pin group associated with the DUT are defined by the programmer. Once defined, the programmer assigns each digital waveform a corresponding signal representation. For example, in FIG. 2 the waveform for the DATA_IN pin group is assigned a signal representation of n/N, and the waveform for the DATA_OUT pin group is assigned a signal representation of L/H.

FIG. 3 shows how the digital waveforms defined using the Waveform Tool are used by the Pattern Tool 300 to create test patterns. The programmer first defines the header. The header is used to associate the columns of the pattern to particular digital pins located in the digital resources. The programmer then uses the signal representations to define the pattern. The pattern shown in FIG. 3 is used to control a strobe pin SB, an inhibit pin IH, four data input pins D1–D4, and sixteen data output pins S0–S15, for example. As each row of the pattern is sequentially executed, each signal representation is interpreted by the ATE and is assigned to the digital waveform defined by the Waveform Tool. The digital resources then produce the desired waveform at the pin corresponding to the column in which each signal representation is located. In this manner the digital resources of the ATE are capable of transmitting and receiving long streams of synchronized digital data.

FIG. 4 shows an example of a graphical user interface 350 for the Cadence debugger. Cadence is a full featured line-by-line compiled test language designed specifically for writing and debugging of Cadence procedures for analog testing. Analog waveforms are defined using the predefined Cadence setup instructions. The programmer uses the Cadence setup instructions to configure the analog resources to provide analog source and measure functionality. By changing the setup instructions the programmer is able to change the frequency, amplitude, and sample rate of the analog signals being transmitted and received by the analog resources of the ATE.

Prior art mixed signal testing is accomplished by linking the digital test methods and the Cadence procedures in the main program. This is accomplished by adding microcode in the digital pattern that sends a signal or triggers an event in the analog instrumentation. This provides a high degree of coupling between the digital and analog systems. However, this method has the disadvantage of making it difficult for the program developer to understand how the separate sections of the program interrelate. In other words, it is difficult for the programmer to understand the operation of the ATE from inspection of the source code. Additionally, this method is disadvantageous because the source code is designed to execute on a particular ATE and is not portable.

SUMMARY AND OBJECTS OF THE INVENTION

An object of the present invention is to provide an automated test system having analog and digital resources with the ability to test mixed signal IC's in a simplified manner with a high degree of synchronization between the analog and digital resources.

Another object of the invention is to provide an automated test system with a sequentially executed two-dimensional control pattern array with columns corresponding to the analog and digital resources for controlling both the analog and digital resources.

Another object of the invention is to provide an automated test system with a pattern having analog and digital waveform signal representations for controlling the operation of the analog and digital resources.

An automated test system is described that has analog and digital resources for testing mixed signal ICs. A control pattern is provided that is used by the automated test system to simultaneously control both the digital resources and the analog resources. The control pattern is comprised of a sequentially executed two-dimensional array with columns corresponding to analog and digital resources. The automated test system uses the control pattern to control both the analog and digital resources.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements, and in which:

FIG. 5A shows a portion of the waveform tool of the present invention.

FIG. 5B shows a pattern of one embodiment of the present invention.

FIG. 6 shows the graphical user interface of the pattern tool and a pattern of one embodiment of the present invention.

DETAILED DESCRIPTION

Figure 1:
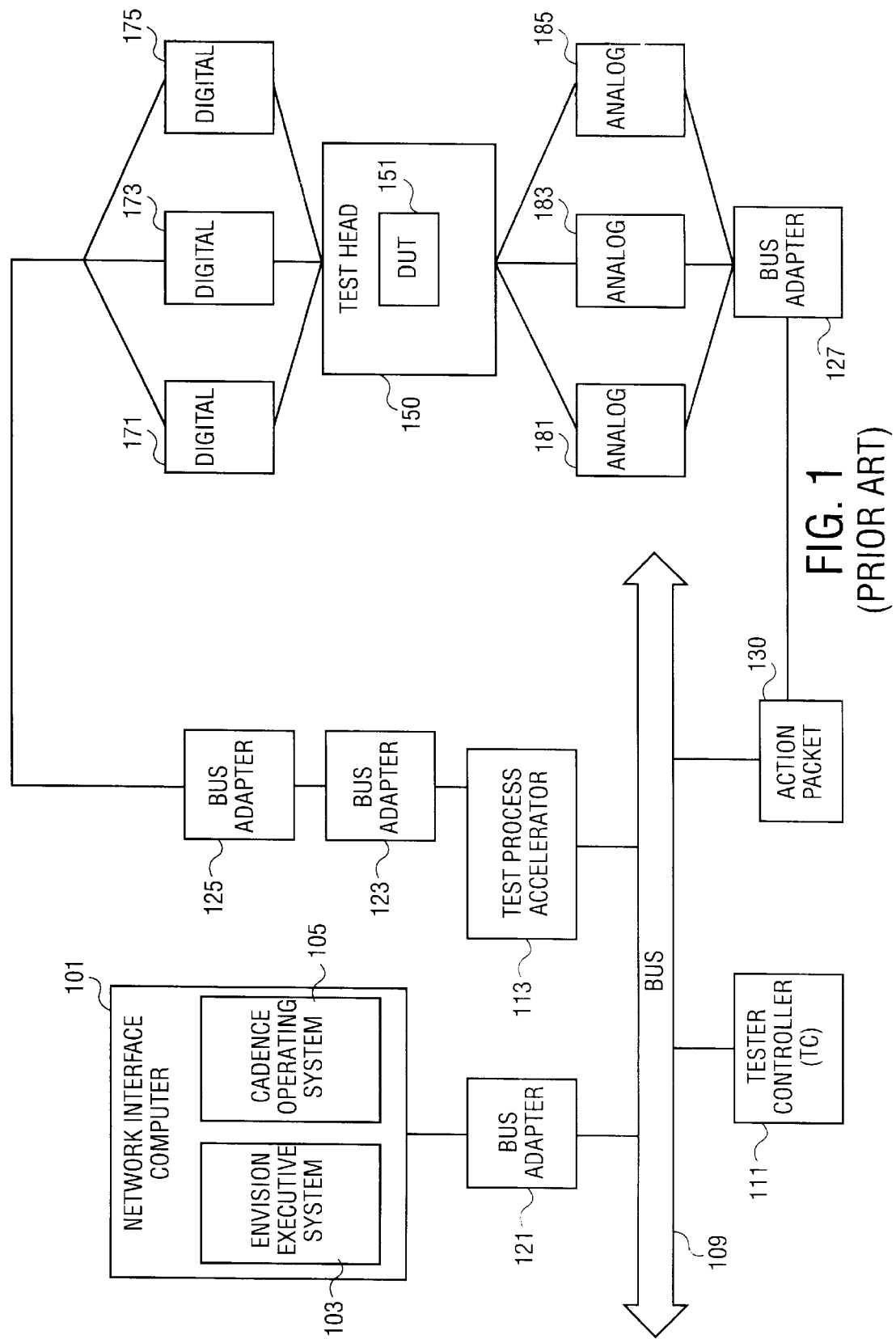
FIG. 1 is a block diagram of an automated tester that shows the configuration of the network interface computer with respect to the tester controller, the test process accelerator, and the digital and analog boards of the test head.
Figure 2:
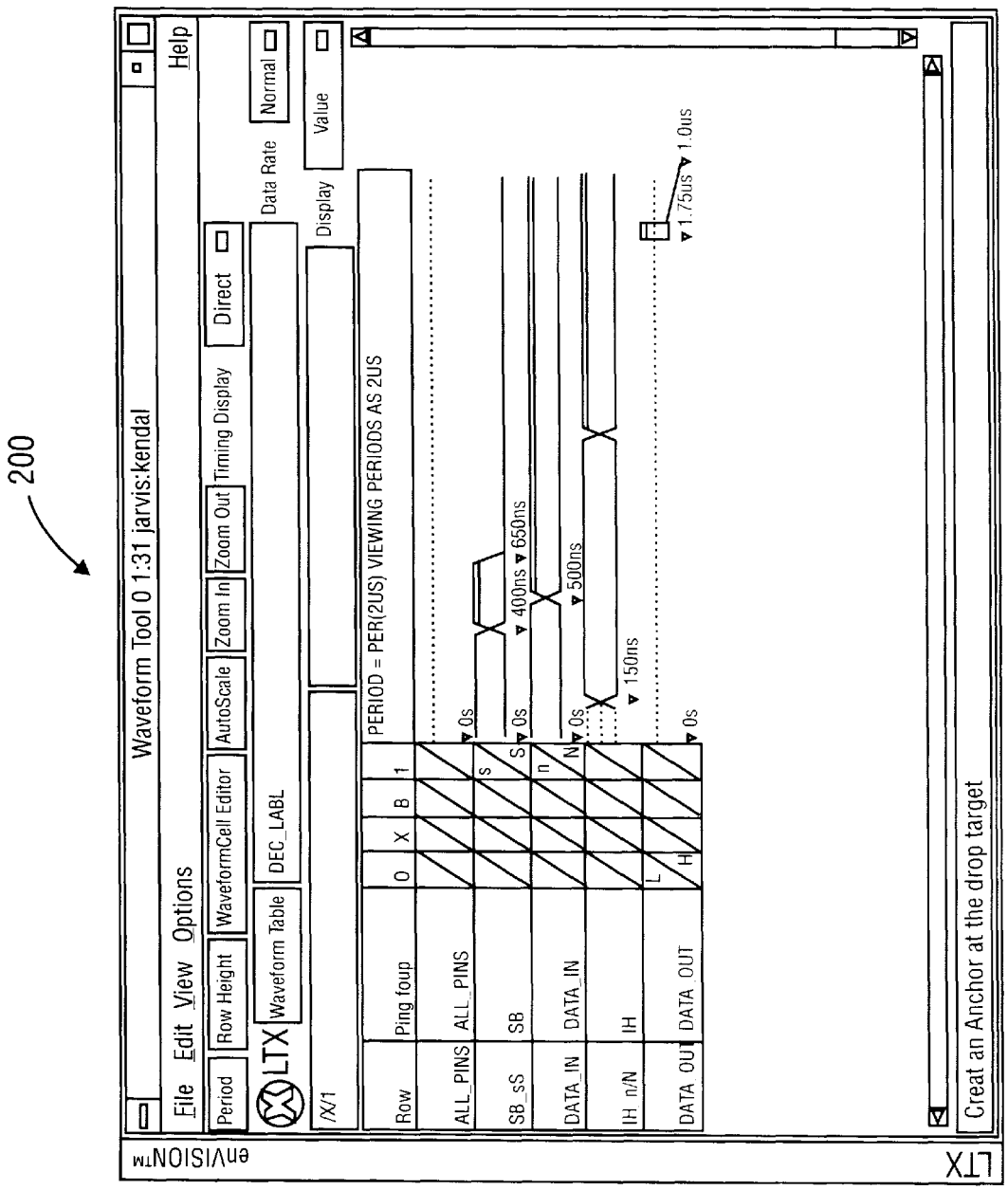
FIG. 2 shows the graphical user interface of the prior art waveform tool.
Figure 3:
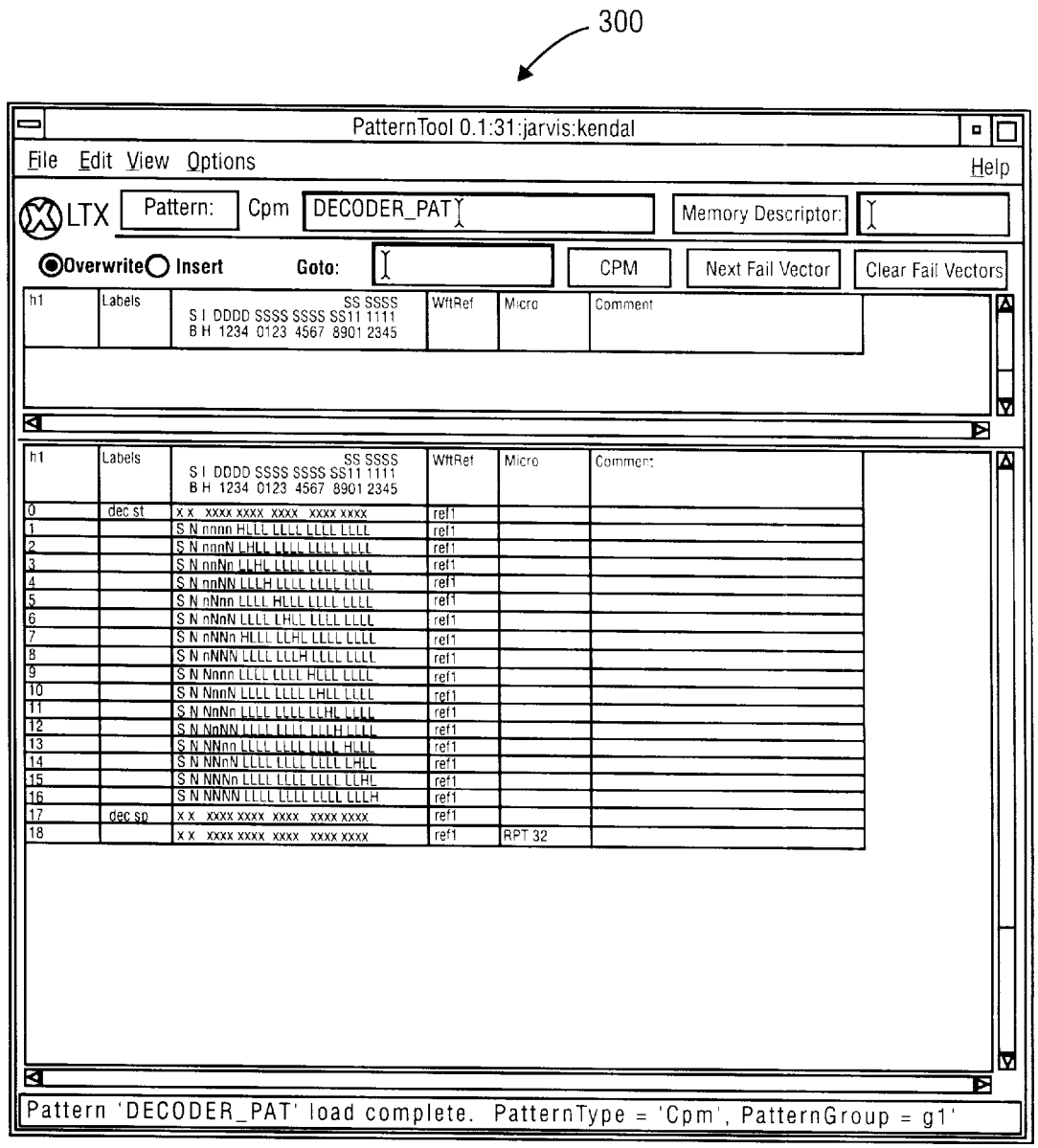
FIG. 3 shows the graphical user interfaces of the prior art pattern tool and an associated prior art pattern.
Figure 4:
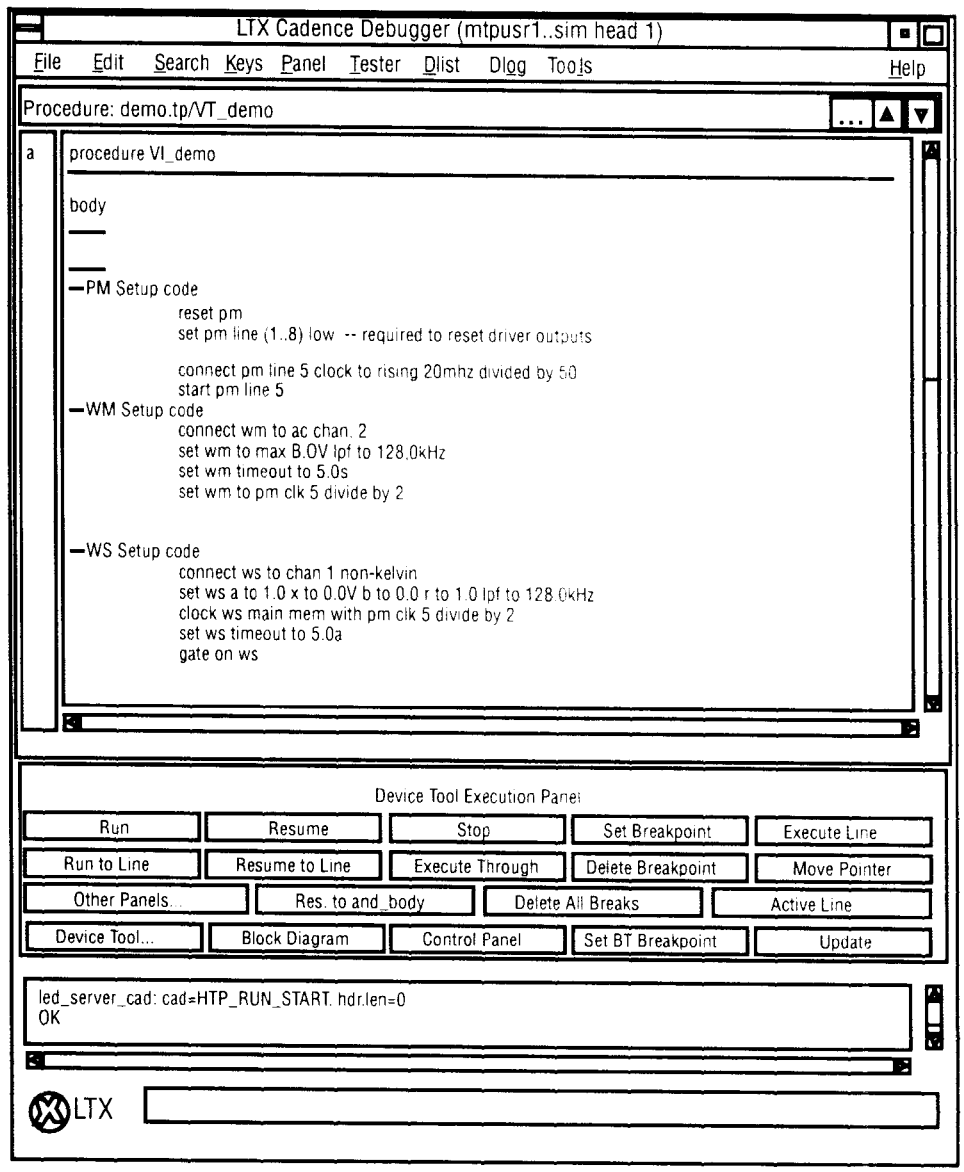
FIG. 4 shows an example of a graphical user interface for the Cadence debugger used in the prior art.

An automated test system is described for testing mixed signal electronics. The automated test system, or ATE, includes both analog and digital resources. A control pattern is provided that is used by the ATE to simultaneously control both the digital resources and the analog resources. The control pattern is comprised of a two-dimensional array which is executed row by row during test program runtime. Software is provided for linking the columns of the pattern with analog and digital resources. The elements of the two-dimensional pattern array are comprised of signal representations which correspond to both analog and digital waveforms. The signal representations are defined and placed within the pattern such that, when executed, the digital and analog hardware associated with the particular column transmit or receive a predefined analog or digital waveform. Signal representations are typically alphanumeric characters. Patterns, therefore, are comprised of a two-dimensional array of such signal representations. Each row of the pattern is executed according to the period of a predefined clock period, and thereby, a high degree of synchronization is achieved between the digital waveforms and the analog waveforms. An analog waveform editor is provided as a user interface for defining waveform objects which contain data for defining the signal representations and the corresponding operations to be performed by the analog and digital resources. The waveform objects are used to configure the system to perform digital capture, digital source, analog send, and analog capture operations.

FIG. 5A shows a portion of the waveform tool 500 of one embodiment of the present invention. The waveform tool 500 is comprised of a plurality of rows containing analog and digital waveforms 510 and 520. The waveform tool 500 is divided into a number of columns. Column 530 is used to assign a row name to the analog or digital waveform defined therein. Column 540 is used to define the pin or pins in the digital or analog resources which are linked to the analog or digital waveform defined in the corresponding row. Column 550 is used to define the signal representations and the pin usage. The "O" column is used to define analog or digital waveforms which are intended to be DUT outputs (ATE inputs). The "I" column is used to define analog or digital waveforms which are intended to be DUT inputs (ATE outputs). "B" is for bi-directional waveforms. "M," or mask, is for send and receive disable or no change.

Row 532 is defined to be the DataIn waveform, which corresponds to a number of digital inputs of the DUT. The programmer can interactively define a desired digital waveform 510 that will be linked to signal representations 552, "0" and "1." The waveform defined in this row by the programmer will be assigned to the digital resources corresponding to the DBus pins 542 that are defined in some other portion of the enVision++ environment.

Row 534 is defined to be the Adcin waveform, which corresponds to an analog output of the ATE and analog input to the DUT. The programmer can interactively define a desired analog waveform 520 which will be linked to signal representations 554, "r," and 555, "s." The declaration of the analog waveform 520 in waveform tool 500 causes the system to load the analog waveform 520 into the analog resources prior to the execution of a pattern. The waveform defined in this row by the programmer will be assigned to the analog resources corresponding to the AdcPin pin group 544 that is defined in some other portion of the enVision++ environment.

Row 562 is defined to be the data strobe or measurement event, which is also assigned to the digital resources corresponding to the Dbus pins 564. The programmer can interactively define a desired data strobe event 568 which will be linked to signal representation "S" 566 for measuring digital signals that are outputs of the DUT.

FIG. 5B shows a two-dimensional pattern array of one embodiment of the present invention. Pattern 560 is comprised of groups of columns that are sequentially executed row by row according to a predefined clock period. The execution time for each row of the pattern is defined by the programmer and referred to as the logic pattern rate. Column 565 corresponds to the individual DBus pins. Column 580 corresponds to the analog pin AdcPin.

Column 570 is a field for specifying microcode. Microcode can be used by the programmer to implement loops, branching, conditional branching, as well as other types pattern execution control. Microcode can also be used to set flags in the system to control other portions of the ATE. Microcode 570 includes (1) LC1 128, to load the integer value of 128 into counter one; (2) DC1, to decrement counter one; (3) RTP 6, to repeat a row of the vector six times; and (4) CJMP, to conditionally jump to another location in the program, for example.

Column 575 is a field for specifying comments. Comments are used by the programmer to remind himself of his programming intentions. Comments are also used to instruct other programmers on how the pattern is executing and what is being effected.

Each column of the pattern corresponds to either a digital or analog pin. The portion of the pattern in column 565 contains signal representations corresponding to the digital waveform defined in rows 532 and 562 of waveform tool 500 for the digital pins defined by DBus. DBus is defined in FIG. 5A to be both a DUT digital input and DUT digital output. As a DUT input, DBus could be used to digitally configure an embedded A/D for converting an analog input into a digital output, for example. As a DUT output, DBus could be used to capture the digital representation of an analog waveform at the output an embedded A/D converter. The portion of the pattern in column 580 contains signal representations corresponding to the analog waveform defined in row 534 of waveform tool 500 for the analog pin defined by AdcPin. AdcPin is defined in FIG. 5A to be a DUT analog input and could be used as the analog input of an embedded A/D, for example.

Pattern 560 is sequentially executed by the ATE system from the top row down. The first three rows of the pattern are used to configure the system and the DUT for testing an embedded A/D. As the first three rows of the pattern are executed by the ATE, the digital signal representations in column 565 are interpreted by the system to configure the digital resources to transmit predefined digital waveforms to the DUT digital inputs. These digital waveforms are received by the DUT inputs to configure the DUT for testing. Additionally, the analog signal representations "r" in column 580 are interpreted by the system to signal the analog resources to get ready for analog testing. Microcode LC1 128 is used in row three to load ATE system counter one with the integer value 128, which is used later in the pattern to control execution.

Analog waveform transmission begins at line four of pattern 560. When row four of pattern 560 is executed by the ATE, the "s" signal representation in column 580 signals the analog resources to begin transmitting predefined analog waveform 520 of FIG. 5A. In the embodiment shown in FIG. 5B, rows four through six comprise an embedded loop having 128 cycles. Each cycle will result in 8 "s" signal representations being executed by the system. A total of 1024 signals will be sent to the analog resources from the pattern. Each signal will cause the analog resources to transmit a portion of the predefined analog waveform 520. Additionally, at row six, the pattern will execute the "S" signal representation corresponding to the predefined data strobe event. This will cause the digital resources associated with DBus to strobe the digital representation of an analog signal at the A/D output, for example. Row six will then jump to label "Cvt" if the counter is non-zero. After completion of the loop, at row seven, the complete analog waveform 520 has been transmitted.

FIG. 6 shows the graphical user interface of the pattern tool 600 and a pattern 620 for one embodiment of the present invention. Pattern tool 600 includes header 610. The header 610 includes (1) an index field 625 to identify the pattern index column; (2) a label field 630 to identify the pattern label column; (3) ATE system device pin fields 635, 640, 645, 650, 655, 660, and 665 for designating the individual system resource pins that are controlled by each column; (4) a waveform field 670 to designate a waveform type; (5) a microinstruction field 675 to identify the pattern microcode column; and (6) a comment field 680.

The pattern shown in FIG. 6 is configured to test the analog and digital inputs and outputs of a CODEC. For CODEC testing, there are six device pin fields. The first field is comprised of a column for controlling the CODEC clock signal and digital inputs to the device. Column 635 of pattern 620 is used to control the digital pin defined as CLK. Columns 640 of pattern 620 are used to control the digital pins defined as TRA, TD0–TD5. These pins are used to transmit digital data to the DUT for testing. The second field of pattern 620 is comprised of column 645 that is used to control the digital pins corresponding to TDC. TDC corresponds to a group of pins that transmit a digital representation of an analog waveform, as described in more detail below. The third field of pattern 620 is comprised of column 650 that is used to control the analog pin corresponding to TAP. TAP corresponds to an analog pin that transmits an analog signal to the DUT. The fourth field of pattern 620 is comprised of column 655 that is used to control the digital pins corresponding to REC, RD0–RD5. These pins are used to receive digital data from the DUT while testing. The fifth field of pattern 620 is comprised of column 660 that is used to control the digital pins corresponding to RDC. RDC corresponds to a group of pins that receive a digital representation of an analog waveform, as described in more detail below. The sixth field of pattern 620 is comprised of column 665 that is used to control the analog pin corresponding to RAP. RAP corresponds to an analog pin that receives an analog signal from the DUT.

Pattern 620 of one embodiment is sequentially executed by the ATE system from the top row down, starting at index position 1, row 1. Row 1 is executed 20 times in accordance with microinstruction RPT 20. The ATE system then sequences to the next row of the pattern at index 2. Each of the columns of row 2 are executed in parallel. Row 2 contains signal representations "wf1", in column 645, and "wf1" in column 650. For one embodiment, when the system executes signal representation "wf1" in column 645, the system will associate a predefined digital representation of an analog waveform with the digital pins corresponding to TDC. In other words, the execution of signal representation "wf1" in column 645 of the pattern will cause the digital resources associated with TDC to begin transmitting predefined digital signals corresponding to an analog waveform to the DUT. Additionally, for one embodiment, when the system executes signal representation "wf1" in column 650, the system will associate a predefined analog waveform with the analog pin corresponding to TAP. The execution of the signal representation "wf1" in column 650 of the pattern will cause the analog resource associated with TAP to begin continuously transmitting a predefined analog signal to the DUT. Row 2 of pattern 620 also contains a microinstruction that causes a counter to be loaded with the value of 256. The ATE system then sequences to the next row at index 3, which contains a microinstruction RPT 4096 for repeating row 3 4096 times to allow the analog voltages to settle.

Row 4 contains signal representations "wf1", in column 660, and "wf1" in column 665. When the ATE system executes "wf1" in column 660, the digital pins associated with RDC are signaled to receive a digital waveform from the DUT. For one embodiment, the digital pins associated with RDC are programmed to receive an expected digital representation of an analog waveform that is related to the analog signal at the analog input of the DUT. Additionally, when the ATE system executes "wf1" in column 665, the analog pin associated with RAP is signaled to receive an analog waveform from the DUT. For one embodiment, the analog pin associated with RAP is programmed to receive an expected analog waveform that is related to the digital representation of an analog waveform at the digital input of the DUT. The system will continue to transmit and receive analog and digital signals as pattern 620 sequentially executed by row according to the microinstructions in column 675. At row 9 the system will begin to transmit a second digital representation of an analog signal associated with signal representation "wf2" in column 645. The system will also begin to transmit a second analog signal associated with signal representation "wf2" in column 650. Signal representations "ca1" in column 660 and "ca1" in column 665 instruct the system to perform predefined calculations on the digital waveforms received by the digital pins associated with RDC and on the analog waveforms received by the analog pins associated with RAP, for example.

Figure 7:
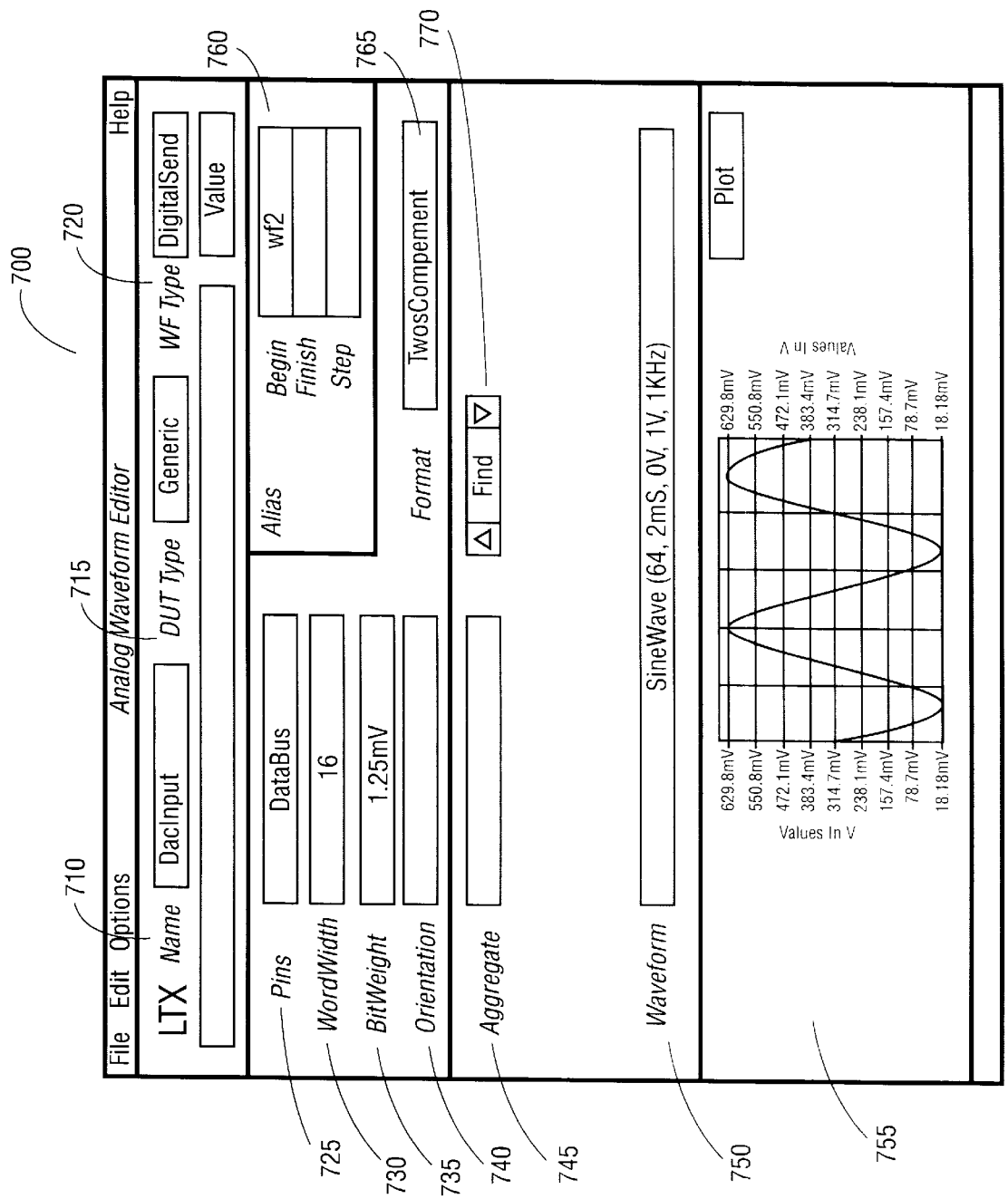
FIG. 7 shows the graphical user interface of the Analog Waveform Editor for editing a digital send waveform object of one embodiment of the present invention.

FIG. 7 shows a graphical user interface of the Analog Waveform Editor 700 for editing digital send waveform objects of one embodiment of the present invention. The waveform object is a data container object for defining a user's intent for a specific analog waveform. In other words, the waveform objects contain data for defining signal representations and system configuration information for the particular analog waveform. The waveform editor is used to specify the type of waveform object and its attributes. The waveform editor of FIG. 7 is used to represent a waveform object of type digital send. This waveform object type would be used if the programmer needs to transmit a digital representation of an analog waveform with the digital resources, for example. Analog Waveform Editor 700 includes a name field 710 for defining a global name that the waveform will be recognized by throughout enVision++. DUT type field 715 specifies the specific DUT type desired. DUT types can be Telecom/Audio, Video, RF Modulation, and Generic, for example. Waveform type ("WF Type") field is used to define the waveform object type desired. Waveform types can be digital capture, digital send, analog capture, and analog send, as described in more detail below.

Analog Waveform Editor 700 further includes a pins field 725 to define the digital pin or groups of pins to compose the digital bus input to the DUT. The order and number of pins is used to define the bits of the bus. Word Width field 730 optionally provides the number of bits in the sourced word. If not defined, the number can be inferred from the number of pins. Bit Weight field 735 optionally provides the least significant bit ("LSB") value of the sourced digital waveform, which can be used to convert floating point waveform arrays into integer arrays. Orientation field 740 optionally provides data orientation of either LSB first or most significant bit ("MSB") first. Aggregate field 745 and access finder 770 allow the programmer to sequence through the list of aggregates with matching type definitions. Aggregates are used to translate the users input into an ASCII form to be used to generate a waveform expression, which in turn controls the system resources. Aggregates can be sine wave, multitone, and ramp, for example. Waveform expression field 750 will be present if no aggregate is selected. If a user selected aggregate has been chosen, this field will be replaced by a graphical user interface template, which can be programmed to define the particular characteristics of the waveform corresponding to the type of aggregate chosen. Plot field 755 shows a plot of the analog waveform. The plot can be optionally chosen by the user to show different characteristics of the waveform. The plot can be in the time domain or frequency domain, for example. Alias field 760 is used to define labels, or signal representations, to be used to refer to actions upon this object by external objects. Three actions supported for digital send can be begin (or start the waveform); finish (or stop the waveform); and step, which is used to single step a waveform, for example. Format field 765 is optionally provided to define the data format to be used for converting a floating point array into an integer array. The formats can be twos complement or sign magnitude, for example.

Figure 8:
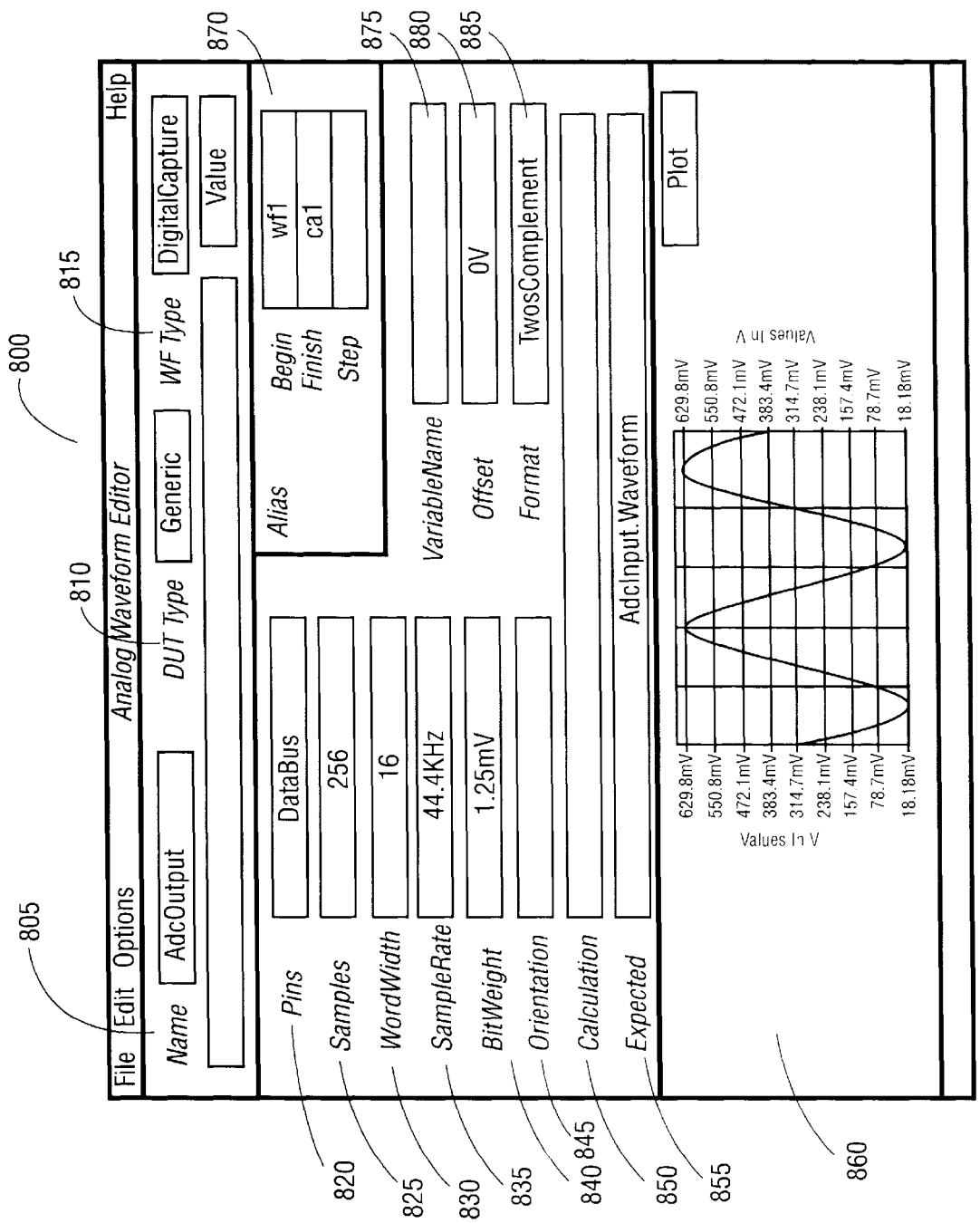
FIG. 8 shows the graphical user interface of the Analog Waveform Editor for editing a digital capture waveform object of one embodiment of the present invention.

FIG. 8 shows the graphical user interface of the Analog Waveform Editor 800 for editing a digital capture waveform object of one embodiment of the present invention. The waveform editor of FIG. 8 is used to represent a waveform object of type digital capture. This waveform object type would be used if the programmer needs to capture the digital representation of an analog waveform with the digital resources, for example. Analog Waveform Editor 800 includes a name field 805 for defining a global name that the waveform will be recognized by throughout enVision++. DUT type field 810 specifies the specific DUT type desired. DUT types can be Telecom/Audio, Video, RF Modulation, and Generic, for example. Waveform type ("WF Type") field 815 is used to define the waveform object type desired. Waveform types can be digital capture, digital send, analog capture, and analog send.

Analog Waveform Editor 800 further includes a pins field 820 to define the digital pin or groups of pins to compose the digital bus input to the DUT. The order and number of pins is used to define the bits of the bus. Samples field 825 defines the expected number of samples to be collected. Word Width field 830 optionally provides the number of bits in the sourced word. If not defined, the number can be inferred from the number of pins. Sample Rate field 835 optionally provides the expected sample rate. The sample rate can be specified either as a frequency, a period of time, or an integer relationship to the logic pattern. Bit Weight field 840 optionally provides the LSB value of the sourced digital waveform which can be used to convert floating point waveform arrays into integer arrays. Orientation field 845 optionally provides data orientation of either LSB first or MSB first. Calculation field 850 optionally provides data calculation formulas to be processed when the digital capture has been completed. Calculations can include fast Fourier transforms, discrete Fourier transforms, noise calculations, and digital filter calculations, for example. Expected waveform field 855 optionally provides a waveform expression for the programmer to describe an expected or reference waveform. The programmer can also use one of the aggregates described above. Plot field 860 shows a plot of the analog waveform. The plot can be optionally chosen by the user to show different characteristics of the waveform. The plot can be in the time domain or frequency domain, for example. Alias field 870 is used to define labels, or signal representations, to be used to refer to actions upon this object by external objects. Three actions supported for digital capture can be begin (or ready for waveform); finish (or download the waveform and start processing); and step, which is used to single step a waveform, for example. Variable name field 875 optionally provides a variable name for the result. If not defined, the waveform object name can be used as the internal variable name. Format field 885 is optionally provided to define the data format to be used for converting a floating point array into an integer array. The formats can be twos complement or sign magnitude, for example. Offset field 880 allows the programmer to optionally specify a DC offset for the waveform.

Figure 9:
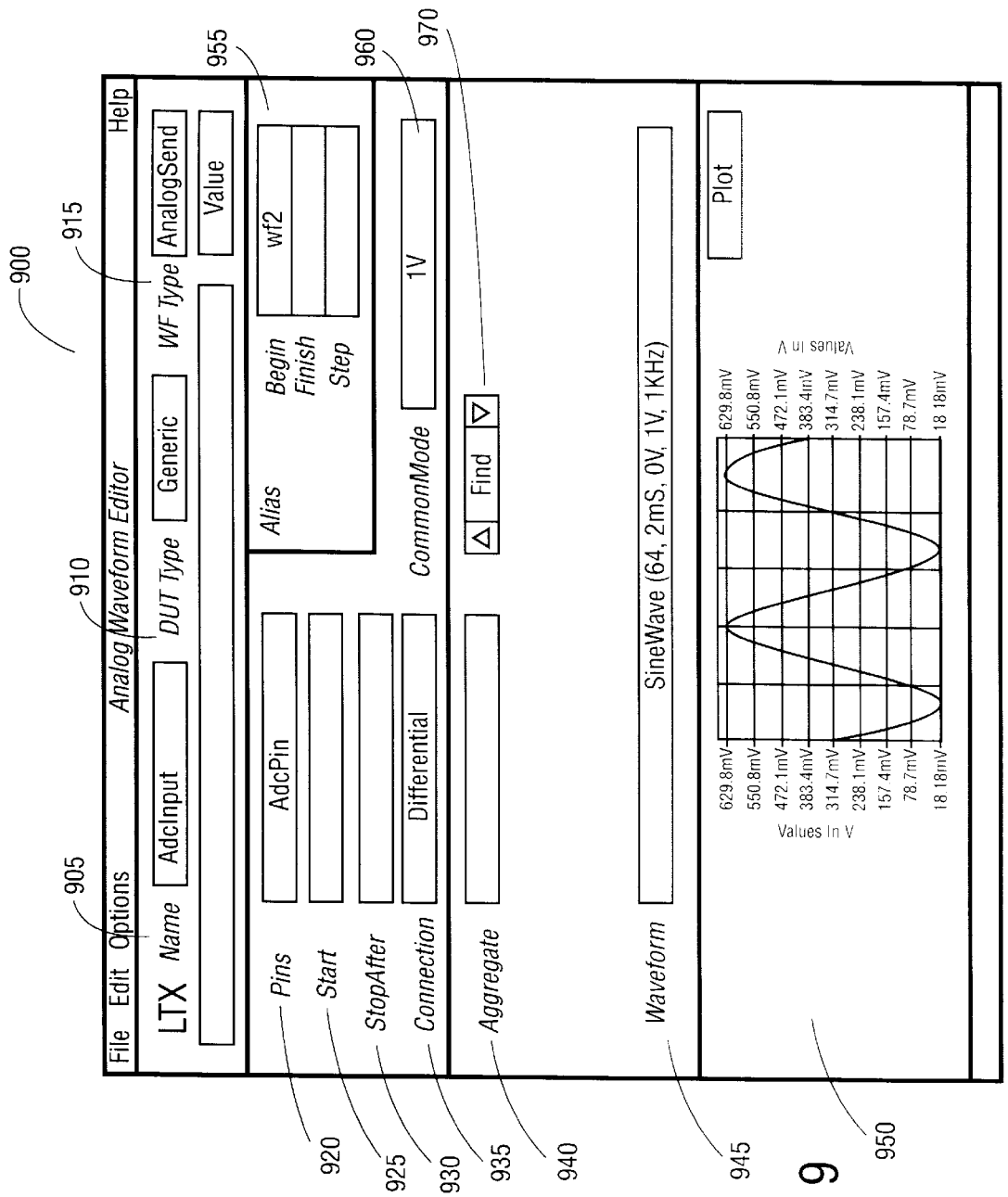
FIG. 9 shows the graphical user interface of the Analog Waveform Editor for editing an analog send waveform object of one embodiment of the present invention.

FIG. 9 shows the graphical user interface of the Analog Waveform Editor 900 for editing a analog send waveform object of one embodiment of the present invention.

The waveform editor of FIG. 9 is used to represent a waveform object of type analog send. This waveform object type would be used if the programmer needs to transmit an analog waveform with the analog resources, for example. Analog Waveform Editor 900 includes a name field 905 for defining a global name that the waveform will be recognized by throughout enVision++. DUT type field 910 specifies the specific DUT type desired. DUT types can be Telecom/Audio, Video, RF Modulation, and Generic, for example. Waveform type ("WF Type") field 915 is used to define the waveform object type desired. Waveform types can be digital capture, digital send, analog capture, and analog send.

Figure 10:
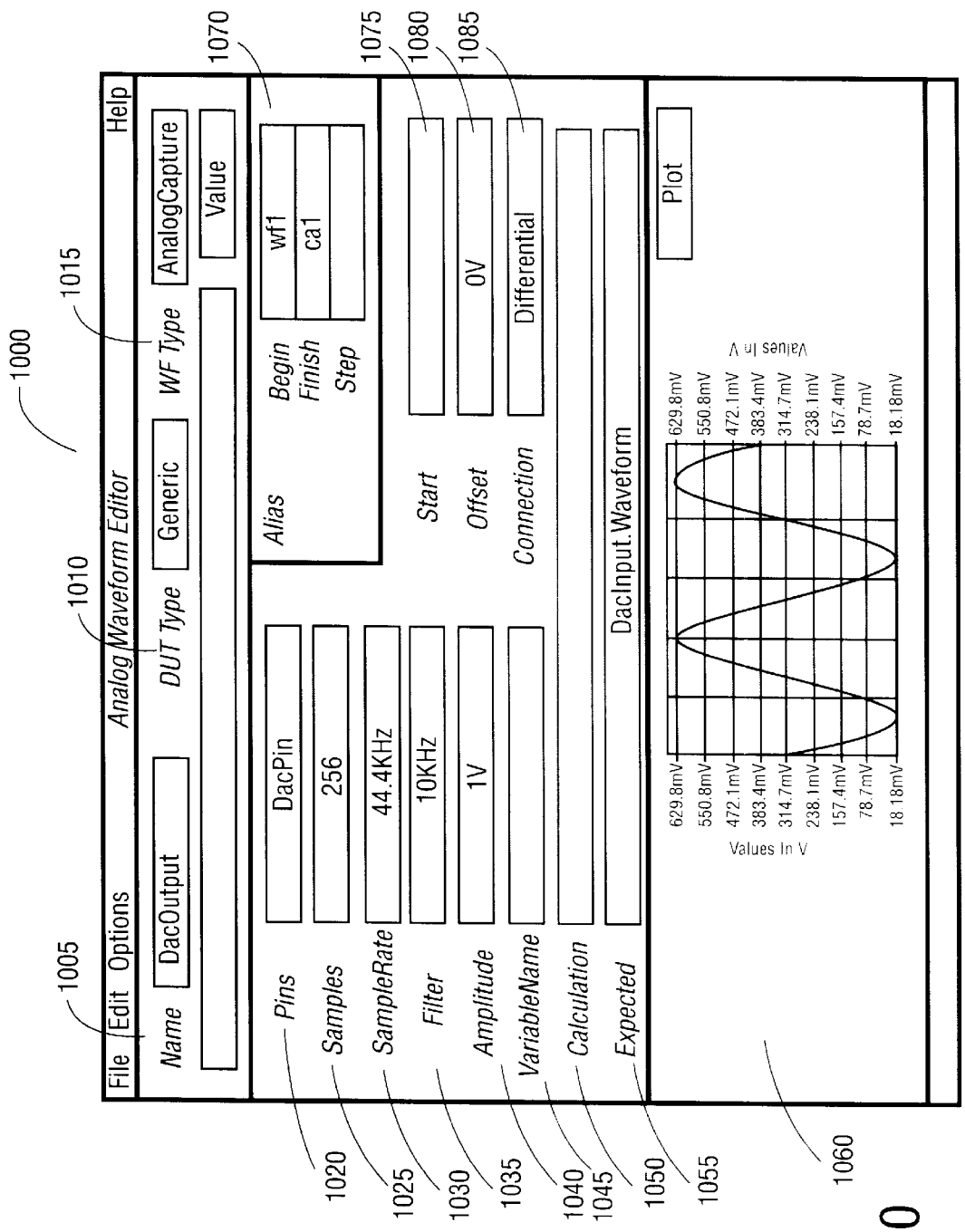
FIG. 10 shows the graphical user interface of the Analog Waveform Editor for editing an analog capture waveform object of one embodiment of the present invention.

Analog Waveform Editor 900 further includes a pins field 920 to define the analog pin to compose the analog input to the DUT. Start field 925 allows the programmer to optionally provide the start condition control. The programmer can specify the start condition to be triggered either by the central processing unit ("CPU Triggered") or by the pattern ("Pattern Triggered"). Stop After field 925 allows the programmer to optionally provide the stop condition control. The programmer can specify the stop condition to be a duration of time or a scalar that will resolve to the number of UTP's. Connection field 935 optionally provides the programmer with the ability to define the pin connection for the analog pin. Pin connections can be differential, single ended, and inverted single ended, for example. Common Mode field 960 is provided to optionally allow the programmer to enter the common mode voltage range. Aggregate field 940 and Access Finder 970 allow the programmer to sequence through the list of aggregates with matching type definitions. Waveform Expression field 945 will be present if no aggregate is selected. If a user selected aggregate has been chosen, this field will be replaced by a graphical user interface template that can be programmed to define the particular characteristics of the waveform corresponding to the type of aggregate chosen. Plot field 950 shows a plot of the analog waveform. The plot can be optionally chosen by the user to show different characteristics of the waveform. The plot can be in the time domain or frequency domain, for example. Alias field 955 is used to define labels, or signal representations, to be used to refer to actions upon this object by external objects. Three actions supported for analog send can be begin (or start the waveform); finish (or stop the waveform); and step, which is used to single step a waveform, for example FIG. 10 shows the graphical user interface of the Analog Waveform Editor for editing an analog capture waveform object of one embodiment of the present invention. The waveform editor of FIG. 10 is used to represent a waveform object of type analog capture. This waveform object type would be used if the programmer needs to capture an analog waveform with the analog resources, for example. Analog Waveform Editor 1000 includes a Name field 1005 for defining a global name that the waveform will be recognized by throughout enVision++. DUT type field 1010 specifies the specific DUT type desired. DUT types can be Telecom/Audio, Video, RF Modulation, and Generic, for example. Waveform type ("WF Type") field 1015 is used to define the waveform object type desired. Waveform types can be digital capture, digital send, analog capture, and analog send.

Analog Waveform Editor 1000 further includes a pins field 1020 to define the analog pin corresponding to the output of the DUT. Samples field 1025 defines the expected number of samples to be collected. Sample Rate field 1030 optionally provides the expected sample rate. The sample rate can be specified either as a frequency, a period of time, or an integer relationship to the logic pattern UTP. If omitted, the sample rate can be calculated from the number of samples divided by the UTP of the expected waveform parameter. Filter field 1035 optionally provides the programmer with the ability to set an internal filter frequency. Amplitude field 1040 can optionally allow the programmer to set the maximum peak to peak amplitude of the expected signal. Variable Name field 1045 optionally provides a variable name for the result. If not defined, the waveform object name can be used as the internal variable name. Calculation field 1050 optionally provides data calculation formulas to be processed when the digital capture has been completed. Calculations can include fast Fourier transforms, discrete Fourier transforms, noise calculations, and digital filter calculations, for example. Expected Waveform field 1055 optionally provides a waveform expression for the programmer to describe an expected or reference waveform. The programmer can also use one of the aggregates described above. Plot field 1060 shows a plot of the analog waveform. The plot can be optionally chosen by the user to show different characteristics of the waveform. The plot can be in the time domain or frequency domain, for example. Alias field 1070 is used to define labels, or signal representations, to be used to refer to actions upon this object by external objects. Three actions supported for analog capture can be begin (or ready for waveform); finish (or download the waveform and start processing); and step, which is used to single step a waveform, for example. Start field 1075 allows the programmer to optionally provide the start condition control. The programmer can specify the start condition to be triggered either by the central processing unit ("CPU Triggered") or by the pattern ("Pattern Triggered"). Offset field 1080 allows the programmer to optionally specify a DC offset for the expected waveform. Connection field 1085 optionally provides the programmer with the ability to define the pin connection for the analog pin. Pin connections can be differential, single ended, and inverted single ended, for example.

Figure 11:
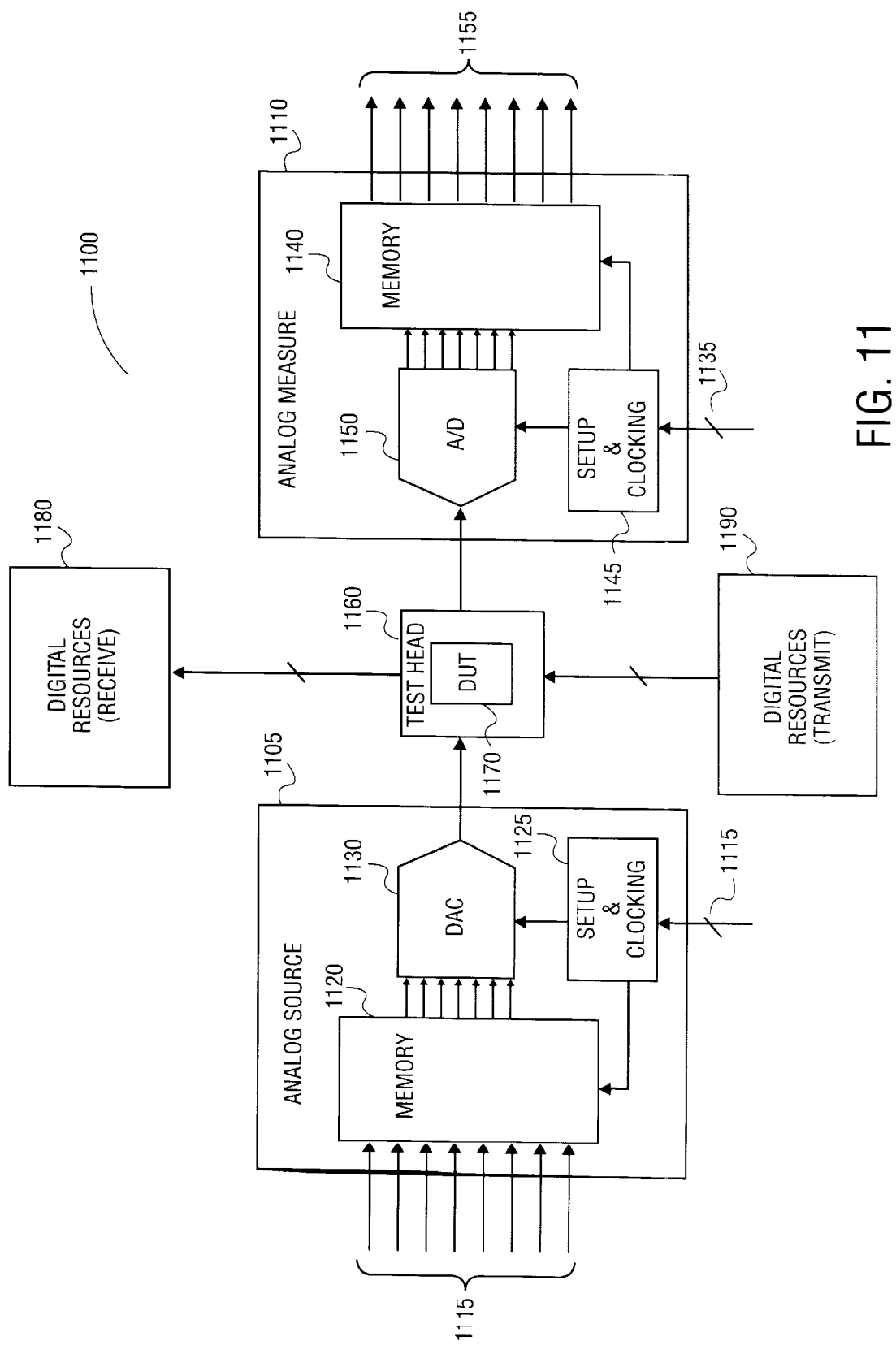
FIG. 11 shows analog source and measure circuitry of one embodiment of the present invention.

FIG. 11 shows analog source and measure circuitry of one embodiment of the present invention. Analog source 1105 receives digital data 1115 from some other part of the ATE and stores the data in memory 1120. Digital data can come from the test controller or can be driven directly by the digital resources, for example. Digital data 1115 characterizes the analog waveform and configures the analog source. Memory 1120 can be a random access memory ("RAM"), for example. In one embodiment, digital data 1115 is also received by a setup and clocking unit 1125. Setup and clocking unit 1125 may contain local processors, microcontrollers, clock dividers, and other necessary components for configuring analog source 1105 to transmit the analog waveform defined by digital data 1115. DAC 1130 receives a digital representation of an analog waveform and configuration and control instructions from memory 1120 and setup and clocking unit 1125. In response to the digital inputs DAC 1130 transmits an analog signal corresponding digital data 1115.

The analog output of DAC 1130 is received by the test head 1160 and DUT 1170. DUT 1170 can be an A/D converter and the analog output of the system can be received by an analog input of the A/D converter, for example. DUT 1170 outputs a digital representation of the analog signal applied to its input. The digital representation of the analog signal is then received by digital resources 1180. Because the analog signal is controlled by a signal representation in a pattern, the analog signal transmitted by the analog source 1105 and the digital signal received by the digital resources 1180 will be in synchronization. Additionally, a programmer working with the test program will be able to understand the operation of the system by evaluating the pattern file.

Digital source 1190 transmits digital data to test head 1160 and DUT 1170. DUT 1170 can be a DAC and the digital output of the system can be received by a digital input of the DAC, for example. DUT 1170 outputs an analog signal corresponding to the digital representation of an analog signal received at its input. The analog signal is then received by analog measure system 110. Analog measure system 1110 is comprised of an A/D converter 1150, a setup and clocking unit 1145, and a memory 1140. Setup and clocking unit 1145 may contain local processors, microcontrollers, clock dividers, and other necessary components for configuring analog measure system 1110 to receive an expected analog waveform. Setup and control unit 1145 receives digital data on input line(s) 1135 and configures the analog measure system 1110 to receive analog waveforms. Memory 1120 can be a random access memory ("RAM"), for example.

A/D converter 1150 receives an analog input from test head 1160. A/D converter 1150 is configured by setup and clocking unit 1145. The analog input is converted into digital data and stored in memory 1140. The digital data can then be sent to other parts of the ATE over digital signal lines 1155. Because the analog signals received by the analog measure system 1110 are controlled by a signal representation in a pattern, the analog signal received by the analog measure system 1110 and the digital signal transmitted by the digital resources 1190 will be in synchronization. Additionally, a programmer working with the test program will be able to understand the operation of the system by evaluating the pattern file.

Thus, an automated test system has been described which includes a pattern for controlling both analog and digital resources for testing mixed signal electronics.

In the foregoing specification, the invention has been described with reference to specific exemplary embodiments thereof. It will, however, be evident that various modifications and changes can be made thereto without departing from the broader spirit and scope of the invention as set forth in the appended claims. The specification and drawings are, accordingly, to be regarded in an illustrative rather than restrictive sense.

What is claimed is:

1. An automated test system comprising:
    a plurality of analog resources;
    a plurality of digital resources;
    a control pattern, the control pattern comprising a sequentially executed two-dimensional array having a first column corresponding to an analog resource of the plurality of analog resources and
    a second column corresponding to a digital resource of the plurality of digital resources,
    the control pattern being used by the automated test system to control the analog resource and the digital resource.

2. The automated test system of claim 1, the sequentially executed two-dimensional array further having a first array element including a first signal representation to control the operation of the analog resource, the first signal representation corresponding to an analog waveform output of the analog resource.

3. The automated test system of claim 2, the sequentially executed two-dimensional array further having a second array element including a second signal representation to control the operation of the digital resource, the second signal representation corresponding to a digital waveform output of the digital resource.

4. The automated test system of claim 3, wherein the first signal representation is executed in parallel with the second signal representation, and the parallel execution of the first and second signal representations is synchronized according to a logic pattern rate.

5. The automated test system of claim 4, wherein the plurality of digital resources are digital pins that can both transmit and receive digital data, and the plurality of analog resources are analog pins.

6. The automated test system of claim 5, wherein the analog pins receive digital data from the automated test system and transmit an analog signal.

7. The automated test system of claim 5, wherein the analog pins receive an analog signal and transmit a digital signal to the automated test system.

8. The automated test system of claim 5, further comprising:
    a network interface computer;
    an analog control system to control operation of the analog pins;
    a digital control system to control operation of the digital pins; and
    a bus coupled between the analog control system and the digital control system;
    wherein the first signal representation corresponds to a plurality of analog control values which represent a predefined analog signal, and the plurality of analog control values are automatically loaded into the analog control system in a first program loading operation; and
    wherein the second signal representation corresponds to a plurality of digital control values which represent a predefined digital signal, and the plurality of digital control values are automatically loaded into the digital control system in the first program loading operation.

9. The automatic test system of claim 8, wherein when the first signal representation is executed within the control pattern, a flag is sent via the bus to trigger the analog control system, the flag being in synchronization with an execution of the second signal representation.

10. The automated test system of claim 8, wherein an execution of the control pattern by the network interface computer causes the analog pins to receive and process a predefined analog signal corresponding to the plurality of analog control values.

11. The automated test system of claim 8, wherein an execution of the control pattern by the network interface computer causes the analog pins to transmit a predefined analog signal corresponding to the plurality of analog control values.

12. The automated test system of claim 3, wherein the first signal representation is comprised of a single alphanumeric character.

13. The automated test system of claim 3, wherein the second signal representation is comprised of a single alphanumeric character.

14. The automated test system of claim 3, wherein the first signal representation is comprised of a plurality of alphanumeric characters.

15. The automated test system of claim 3, further comprising an analog waveform editor to define waveform objects, the waveform objects containing data to define the first and second signal representations and corresponding operations to be performed by the analog and digital resources.

16. The automated test system of claim 15, wherein the waveform objects are digital capture objects to configure the plurality of digital resources to capture a digital representation of an analog waveform.

17. The automated test system of claim 16, wherein the digital capture objects are comprised of:
a pins field to associate a digital representation of the analog waveform with associated digital pins in the plurality of digital resources;
a samples field to define a number of samples in a digital representation of the analog waveform;
a sample rate field to define a sample rate of a digital representation of the analog waveform; and
an alias field to define the second signal representation to a digital representation of the analog waveform.

18. The automated test system of claim 15, wherein the waveform objects are digital send objects to configure the plurality of digital resources to transmit a digital representation of an analog waveform.

19. The automated test system of claim 18, wherein the digital send objects are comprised of:
a pins field to associate a digital representation of the analog waveform with associated digital pins in the plurality of digital resources;
a waveform field to define a software representation of the analog waveform; and
an alias field to define the second signal representation to a digital representation of the analog waveform.

20. The automated test system of claim 15, wherein the waveform objects are analog capture objects to configure the plurality of analog resources to receive and to process an analog waveform.

21. The automated test system of claim 20, wherein the analog capture objects are comprised of:
a pins field to associate the analog waveform with an associated analog pin in the analog resource;
a samples field to define a number of samples to be taken of the analog waveform;
a sample rate field to define a sample rate at which to capture the analog waveform; and
an alias field to define the second signal representation to the analog waveform.

22. The automated test system of claim 15, wherein the waveform objects are analog send objects to configure the plurality of analog resources to transmit an analog waveform.

23. The automated test system of claim 22, wherein the analog send objects are comprised of:
a pins field to associate the analog waveform with associated analog pins in the plurality of analog resources;
a waveform field to define a software representation of the analog waveform; and
an alias field to define the second signal representation to the analog waveform.

24. An automated test system having analog and digital resources controlled by a sequential execution of a pattern, the automated test system comprising:
means for defining an analog software waveform to be transmitted or received by an analog resource;
means for defining a digital software waveform to be transmitted or received by a digital resource; and
means for creating a pattern comprised of a sequentially executed two-dimensional array with columns corresponding to the analog and digital resources, wherein the sequential execution of the pattern causes the analog resources to transmit or receive an analog waveform corresponding to the analog software waveform and the digital resources to transmit or receive a digital waveform corresponding to the digital software waveform.

25. The automated test system of claim 24, further comprising:
means for associating the digital software waveform with a digital signal representation; and
means for associating the analog software waveform with an analog signal representation;
the pattern having array elements comprised of a plurality of analog and digital signal representations to control the operation of the analog and digital resources.

26. An automated test system having analog and digital resources controlled by the execution of a pattern, the pattern comprising:
a plurality of columns corresponding to one or more analog pins and one or more digital pins; and
a plurality of sequentially executed rows, each row being executed synchronously according to a logic pattern rate, wherein upon execution of a given row, one or more of the analog pins and one or more of the digital pins executes a predefined operation.

27. The automated test system of claim 26, wherein the pattern further comprises:
a plurality of digital signal representation elements corresponding to the intersection of a row and a column, each of the plurality of digital signal representation elements linking a predefined operation to the digital pin corresponding to the particular column; and
a plurality of analog signal representation elements corresponding to the intersection of a row and a column, each of the plurality of analog signal representation elements linking a predefined operation to the analog pin corresponding to the particular column.

28. An automated test system comprising:
analog resources having a digital-to-analog section to receive first digital data and transmit analog waveforms, and an analog-to-digital section to receive analog waveforms and transmit second digital data, the analog resources being digitally configurable;
digital resources to transmit and receive digital data; and
a sequentially executed two-dimensional control pattern array to configure the digital-to-analog section to receive the first digital data and transmit a predetermined analog signal and to configure the analog-to-digital section to receive a predetermined analog signal and transmit the second digital data, the sequentially executed two-dimensional control pattern array having columns corresponding to the analog and digital resources.

29. The automated test system of claim 28, wherein the sequentially executed two-dimensional control pattern array includes a plurality of array elements comprised of a plurality of analog and digital signal representations to control operation of the analog and digital resources.

30. A method of operating an automated test system having analog and digital resources controlled by a sequential execution of a pattern, the method comprising:
defining an analog software waveform to be transmitted or received by an analog resource;

defining a digital software waveform to be transmitted or received by a digital resource; and creating a pattern comprised of a sequentially executed two-dimensional array with columns corresponding to the analog and digital resources, wherein the sequential execution of the pattern causes the analog resources to transmit or receive an analog waveform corresponding to the analog software waveform and the digital resources to transmit or receive a digital waveform corresponding to the digital software waveform.

31. The method of claim 30, further comprising:

associating the digital software waveform with a digital signal representation; and associating the analog software waveform with an analog signal representation;

the sequentially executed two-dimensional array having array elements comprised of a plurality of analog and digital signal representations to control operation of the analog and digital resources.

32. A method of executing tests on an automated test system having digital and analog resources, comprising the steps of:

presenting to a user of the automated test system a computer-generated graphical user interface for defining a analog send object for configuring the analog resources to send an analog waveform;

receiving an input from the user which defines the analog waveform to be transmitted;

receiving an input from the user which defines the analog pin to be used to transmit the analog waveform;

receiving an input from the user which defines a signal representation for the analog send waveform object; and creating a pattern comprised of a sequentially executed two-dimensional array having a column which includes the signal representation, the column corresponding to the predefined analog pin;

executing the pattern, causing the predefined analog pin to transmit an analog waveform corresponding to the predefined analog send waveform object.

33. A method of executing tests on an automated test system having digital and analog resources, comprising the steps of:

presenting to a user of the automated test system a computer-generated graphical user interface for defining a analog capture object for configuring the analog resources to receive an analog waveform;

receiving an input from the user which defines the analog waveform to be received;

receiving an input from the user which defines the analog pin to be used to receive the analog waveform;

receiving an input from the user which defines a signal representation for the analog capture waveform object; and creating a pattern comprised of a sequentially executed two-dimensional array having a column which includes the signal representation, the column corresponding to the predefined analog pin;

executing the pattern, causing the predefined analog pin to receive an analog waveform corresponding to the predefined analog capture waveform object.

34. A computer-readable storage medium containing executable instructions which when executed by a digital processing system cause the digital processing system to perform a method comprising:

mapping columns of a two-dimensional control pattern array to a plurality of analog resources and a plurality of digital resources;

linking an analog signal representation element of a first column of the two-dimensional control pattern array to a digital representation of an analog waveform; and linking a digital signal representation element of a second column of the two-dimensional control pattern array to a digital waveform.

35. The computer-readable storage medium of claim 34, the method further comprising:

executing the digital signal representation element in parallel with the analog signal representation element, wherein executing the digital signal representation element in parallel with the analog signal representation element is synchronized according to a logic pattern rate.

36. An automated test system comprising:

an analog resource;

a digital resource; and a control pattern corresponding to a first signal for the analog resource and a second signal for the digital resource as strings in the control pattern, such that the first signal for analog resource is represented similarly to the second signal for the digital resource.

37. The automated test system of claim 36, wherein a parallel execution of the analog and digital signal representations is synchronized according to a logic pattern rate.

* * * * *